(12) United States Patent
Li et al.

(10) Patent No.: US 10,426,023 B2
(45) Date of Patent: Sep. 24, 2019

(54) SYSTEMATIC COUPLING BALANCE SCHEME TO ENHANCE AMPLITUDE AND PHASE MATCHING FOR LONG-TRAVELING MULTI-PHASE SIGNALS

(71) Applicant: The Regents of the University of California, Oakland, CA (US)

(72) Inventors: Jinbo Li, Davis, CA (US); Qun Gu, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 54 days.

(21) Appl. No.: 15/891,230

(22) Filed: Feb. 7, 2018

(65) Prior Publication Data

US 2018/0234082 A1 Aug. 16, 2018

Related U.S. Application Data (60) Provisional application No. 62/458,864, filed on Feb. 14, 2017.

(51) Int. Cl.
| | | |
|---|---|---|
| *H03H 19/00* | (2006.01) | |
| *H05K 1/02* | (2006.01) | |
| *H01P 3/08* | (2006.01) | |
| *H03F 3/00* | (2006.01) | |
| *H03F 3/45* | (2006.01) | |
| *H01L 23/52* | (2006.01) | |

(52) U.S. Cl.
CPC ........... *H05K 1/0228* (2013.01); *H01L 23/52* (2013.01); *H01P 3/08* (2013.01); *H03F 3/005* (2013.01); *H03F 3/45479* (2013.01); *H03H 19/002* (2013.01); *H05K 1/0245* (2013.01)

(58) Field of Classification Search
CPC .... H03H 19/002; H03H 2/00; H01P 3/00–10; H05K 1/0228; H05K 1/0245
See application file for complete search history.

(56) References Cited

U.S. PATENT DOCUMENTS 3,761,842 A * 9/1973 Gandrud ................... H01B 7/08
   333/1
5,430,247 A * 7/1995 Bockelman ........... H01L 23/528
   174/250
6,951,978 B1 * 10/2005 Norman ............... H05K 1/0228
   174/27

(Continued)

*Primary Examiner* — Dean O Takaoka
*Assistant Examiner* — Alan Wong
(74) *Attorney, Agent, or Firm* — Park, Vaughan, Fleming & Dowler LLP (57) ABSTRACT

The disclosed embodiments relate to the design of a system that implements a coupling balance scheme for differential signals. The system includes a set of 2N signal lines carrying N differential signal pairs, wherein the set of 2N signal lines runs parallel to each other in a planar layout. The set of 2N signal lines is organized into a set of consecutive sequences, wherein each sequence includes a pattern of twists that switch signal positions for each differential pair to cancel coupling effects with respect to other signal lines. Moreover, the positions of differential signal pairs are exchanged between consecutive sequences, so that the set of consecutive sequences includes a sequence for each possible ordering of the N differential signal pairs.

10 Claims, 8 Drawing Sheets

(56) References Cited

U.S. PATENT DOCUMENTS

| | | | |
|---|---|---|---|
| 8,143,966 B2* | 3/2012 | Merritt | H01P 3/081 |
| | | | 174/261 |
| 9,240,619 B2* | 1/2016 | Howard | H01P 1/184 |
| 10,044,085 B2* | 8/2018 | Ma | H01P 3/08 |
| 2015/0373837 A1* | 12/2015 | Frye | H01P 3/081 |
| | | | 333/4 |

* cited by examiner

FIG. 3B $$IP = \vec{S_{51}} + \vec{S_{52}} \cdot e^{-j180°} + \vec{S_{53}} \cdot e^{-j90°} + \vec{S_{54}} \cdot e^{-j270°}$$

$$IN = \vec{S_{61}} + \vec{S_{62}} \cdot e^{-j180°} + \vec{S_{63}} \cdot e^{-j90°} + \vec{S_{64}} \cdot e^{-j270°}$$

$$QP = \vec{S_{71}} + \vec{S_{72}} \cdot e^{-j180°} + \vec{S_{73}} \cdot e^{-j90°} + \vec{S_{74}} \cdot e^{-j270°}$$

$$QN = \vec{S_{81}} + \vec{S_{82}} \cdot e^{-j180°} + \vec{S_{83}} \cdot e^{-j90°} + \vec{S_{84}} \cdot e^{-j270°}$$

|  |  | < 0.2dB BW | < 1° BW | < 1° BW |
|---|---|---|---|---|
| IN Signal | Ref. Sim. | 200 MHz | 310 MHz | 390 MHz |
|  | Ref. Meas. | 200 MHz | 330 MHz | 435 MHz |
|  | Prop. Sim. | 500 MHz | 600 MHz | 690 MHz |
|  | Prop. Meas. | > 1 GHz | 360 MHz | 610 MHz |
| QP Signal | Ref. Sim. | 310 MHz | 75 MHz | 130 MHz |
|  | Ref. Meas. | 310 MHz | 75 MHz | 131 MHz |
|  | Prop. Sim. | 830 MHz | 520 MHz | 610 MHz |
|  | Prop. Meas. | 887 MHz | 580 MHz | 660 MHz |
| QN Signal | Ref. Sim. | 100 MHz | 140 MHz | 230 MHz |
|  | Ref. Meas. | 124 MHz | 178 MHz | 265 MHz |
|  | Prop. Sim. | > 1 GHz | 760 MHz | 820 MHz |
|  | Prop. Meas. | > 1 GHz | 388 MHz | 660 MHz |
| Equivalent Phase Error | Ref. Sim. |  | 115 MHz | 180 MHz |
|  | Ref. Meas. |  | 135 MHz | 200 MHz |
|  | Prop. Sim. |  | 790 MHz | > 1 GHz |
|  | Prop. Meas. |  | 680 MHz | 900 MHz |

SYSTEMATIC COUPLING BALANCE SCHEME TO ENHANCE AMPLITUDE AND PHASE MATCHING FOR LONG-TRAVELING MULTI-PHASE SIGNALS

CROSS-REFERENCE TO RELATED APPLICATION

This application claims the benefit of U.S. Provisional Patent Application No. 62/458,864, entitled "Systematic Coupling Balance Scheme to Enhance Amplitude and Phase Matches for Long-Traveling Multi-Phase Signals," by inventors Jinbo Li and Qun Gu, filed on 14 Feb. 2017, the contents of which are incorporated by reference herein.

GOVERNMENT LICENSE RIGHTS

This invention was made with U.S. government support by the Office of Naval Research under Grant No. N00014-14-1-0257. The U.S. government has certain rights in the invention.

BACKGROUND

Field

The disclosed embodiments generally relate to techniques for mitigating the effects of dispersion and mutual coupling among signal lines. More specifically, the disclosed embodiments relate to a systematic coupling balance scheme to enhance amplitude and phase matches for long-travelling multi-phase signal lines.

Related Art

As technological advances cause signal frequencies to increase and corresponding signal line spacings to decrease, mutual coupling among signal lines increases. This increased mutual coupling gives rise to a variety of problems, including: increased crosstalk for high-speed interconnections; increased co-channel interference for wireless communications; and increased IQ imbalances for quadrature signals. This problem becomes even worse when signal line lengths increase.

Hence, what is needed is a technique for effectively reducing mutual coupling among signal lines in high-performance electronic systems.

SUMMARY

The disclosed embodiments relate to the design of a system that implements a coupling balance scheme for differential signals. The system includes a set of 2N signal lines carrying 2N differential signal pairs, wherein the set of N signal lines runs parallel to each other in a planar layout. The set of 2N signal lines is organized into a set of consecutive sequences, wherein each sequence includes a pattern of twists that switch signal positions for each differential pair to caned coupling effects with respect to other signal lines. Moreover, the positions of differential signal pairs are exchanged between consecutive sequences, so that the set of consecutive sequences includes a sequence for each possible ordering of the N differential signal pairs.

In some embodiments, two of the N differential signal pairs carry a set of quadrature signals, including: an in-phase signal I carried by a first differential signal pair $I_P$ and $I_N$; and a quadrature-phase signal Q carried by a second differential signal pair $Q_P$ and $Q_N$.

In some embodiments, the ordering of $I_P$, $I_N$, $Q_P$ and $Q_N$ are not specified and can be arbitrary.

In some embodiments, the implementations of V-type scheme on quadrature signals are: at a first location, the first and second signal lines twist; at a second location, the third and fourth signal lines twist; and at a third location, the first and second signal lines twist.

In some embodiments, the implementations of V-type scheme on quadrature signals are: at a first location, the third and fourth signal lines twist; at a second location, the first and second signal lines twist; and at a third location, the third and fourth signal lines twist.

In some embodiments, the implementations of V-type scheme on quadrature signals are: at a first location, the first and second signal lines twist; at a second location, the third and fourth signal lines twist, and the third and fourth signal lines twist; and at a third location, the first and second signal lines twist.

In some embodiments, the implementations of V-type scheme on quadrature signals are: at a first location, the third and fourth signal lines twist; at a second location, the first and second signal lines twist, and the third and fourth signal lines twist; and at a third location, the third and fourth signal lines twist.

In some embodiments, the set of 2N signal lines comprises four signal lines, including a first signal line, a second signal line, a third signal line and a fourth signal line, which carry differential signals $D_{1P}$, $D_{1N}$, $D_{2P}$ and $D_{2N}$, respectively. In these embodiments, the two aforementioned methods are combined to remove effects of the twists themselves. The pattern of twists in the V-type cancellation scheme is defined so that: at a first location, the first and second signal lines twist; at a second location, the first and second signal lines twist, and the third and fourth signal lines twist; at a third location, the first and second signal lines twist; at a fourth location, the third and fourth signal lines twist; at a fifth location, the first and second signal lines twist, and the third and fourth signal lines twist; and at a sixth location, the third and fourth signal lines twist.

In some embodiments, the set of 2N signal lines is fabricated on a printed circuit board.

In some embodiments, the set of 2N signal lines is fabricated on a semiconductor layer.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

The disclosed embodiments provide a systematic coupling balance technique to enhance signal matches for long-traveling N-pair differential signals. To analyze this problem, an analysis is conducted on 2N lines with closed-form expressions to identify three factors that lead to coupling imbalances. A systematic technique is presented to address the three factors to facilitate balanced coupling for signals based on various twisting schemes.

The effectiveness of this technique is demonstrated on an exemplary FR4 printed-circuit board (PCB) for IQ traces, which shows great suppression of IQ imbalances with well-matched simulation and measurement results. During this analysis, non-idealities of the twists themselves are considered and mitigated by combining two different twisting schemes. The bandwidth with 1° degree mismatch is boosted from 75 MHz to 360 MHz, or from 135 MHz to 680 MHz considering the overall effects of the four signals. This technique requires no additional power or complex circuits or processes, and can be extended to high frequencies through scaling of structure size.

Causes of Signal Degradation

Figure 1:
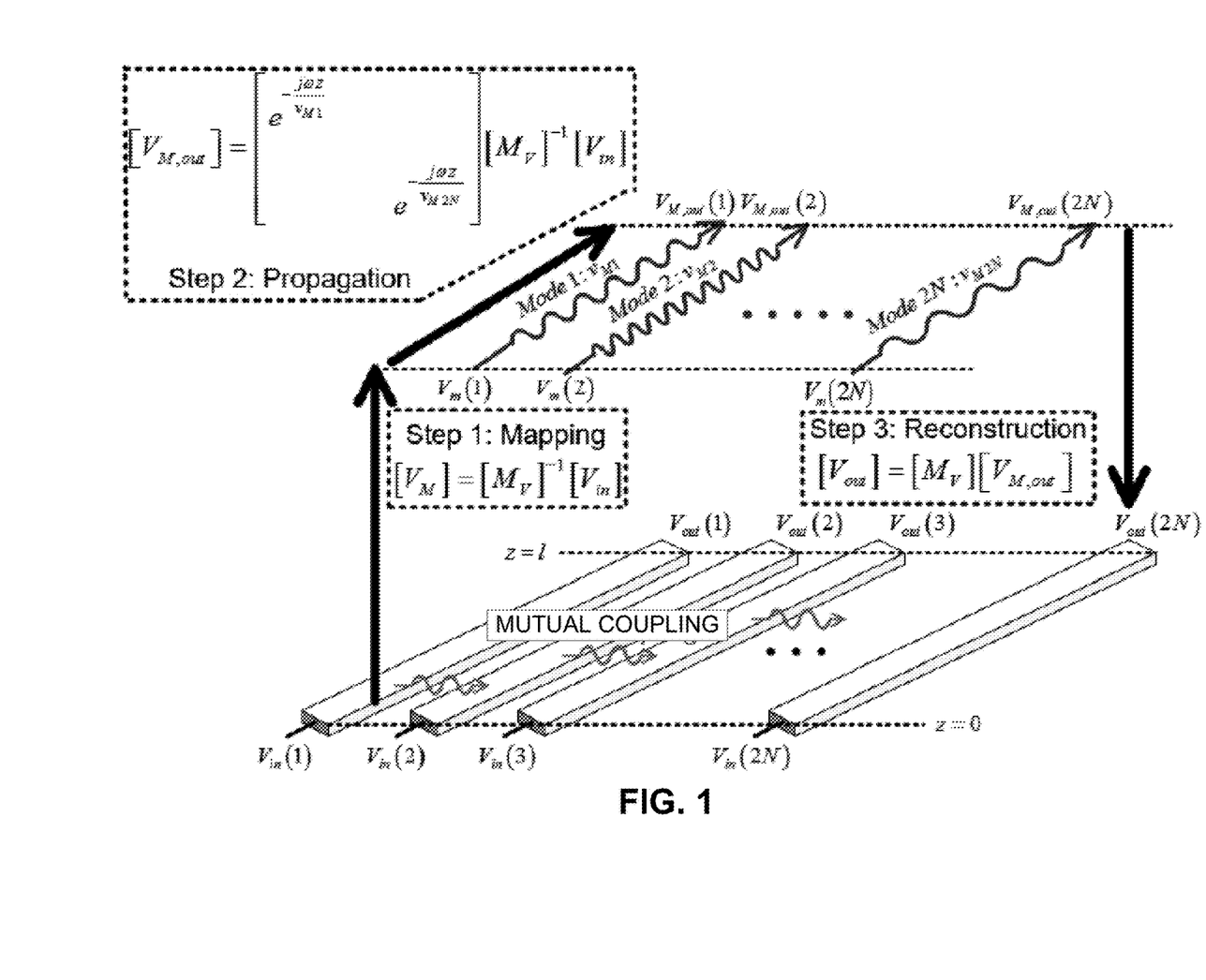
FIG. 1 illustrates an exemplary set of 2N signal lines in accordance with the disclosed embodiments.

FIG. 1 illustrates an exemplary set of 2N signal lines, which are used to transmit N differential signal pairs in accordance with the disclosed embodiments. As illustrated in FIG. 1, input voltage signals are mapped to different modes by the inverse of a voltage eigenvector matrix $[M_V]^{-1}$. Then, each mode signal propagates along an associated transmission line with different velocities. Finally, the different mode signals are reconstructed by multiplying $[M_V]$ to form output signals. (We assume each mode is matched at its characteristic impedance.)

As illustrated in FIG. 1, the transmission of input signal vector $[V_{in}]$ involves three steps: mapping, propagation and reconstruction. Note that each term of the output vector $[V_{out}]$ can be algebraically expressed as, $$V_{out,j}(z) \mid j \in [0, \ldots, 2N] = \sum_{i=1}^{2N} \sum_{Mk=1}^{2N} A(j)_{iMk} V_{in}(i) e^{\frac{j\omega z}{v_{Mk}}}, \quad (1)$$

where j represents the $j_{th}$ line as the victim net, i represents the $i_{th}$ line as the aggressor net, Mk represents the $Mk_{th}$ mode, z is the propagation distance, $v_{Mk}$ is the velocity of the $Mk_{th}$ mode, and $A(j)_{iMk}$ represents the effect of the signal of the $i_{th}$ line on the $j_{th}$ line at the $Mk_{th}$ mode.

For the N differential signal pairs, assume the $j_{th}$ line is the first line in its differential pair. This means equation (1) can be rewritten as follows.

$$V_{out,j}(z) = \sum_{i=1}^{N} \sum_{Mk=1}^{2N} (-A(j)_{(2i-1)Mk} V_{in,2i} + A(j)_{2iMk} V_{in,2i}) e^{\frac{j\omega z}{v_{Mk}}} = \quad (2)$$

$$\underbrace{\sum_{Mk=1}^{2N} A(j)_{jMk} V_{in,j} e^{\frac{j\omega z}{v_{Mk}}}}_{\text{Factor 1: Self dispersion}} - \underbrace{\sum_{Mk=1}^{2N} A(j)_{(j+1)Mk} V_{in,j} e^{\frac{j\omega z}{v_{Mk}}}}_{\text{Factor 2: Impact of the other line in the diff. pair}} +$$

$$\underbrace{\sum_{i=1}^{N, i \neq \frac{k+1}{2}} \sum_{Mk=1}^{2N} (-A(j)_{(2i-1)Mk} V_{in,2i} + A(j)_{2iMk} V_{in,2i}) e^{\frac{j\omega z}{v_{Mk}}}}_{\text{Factor 3: Impacts of other differential signal pairs}}$$

As seen from equation (2), the $j_{th}$ line is affected by three factors: (factor 1) its own dispersions; (factor 2) effects of the other lines in the same differential pair; and (factor 3) effects from other differential signals. Note that the signals cannot be fully reconstructed at the output ends even when each mode is matched at its characteristic impedance.

Coupling Balance Technique

Factor 1 can be addressed by twisting the $j_{th}$ signal to traverse all the lines. Therefore, the output voltage due to effects of factor 1 can be written as $$V_{out,j}(z)\_F1 = \sum_{Mk=1}^{2N}\left(\sum_{i=1}^{2N} A(i)_{iMk}\right)V_{in}(j)e^{\frac{j\omega z}{v_{Mk}}} = \sum_{Mk=1}^{2N} C0_{Mk}V_{in}(j)e^{\frac{j\omega z}{v_{Mk}}}. \quad (3)$$

In this way, the signal portion of the $j_{th}$ input at the $Mk_{th}$ mode, which is represented as $C0_{Mk}$, becomes independent of the line number i and holds the same for each signal line. Note that all of the signals will have the same portions travelling at the $Mk_{th}$ mode if they are twisted onto all lines. To address factor 2, the $j_{th}$ signal is switched with the $(j+1)_{th}$ signal for each signal pair in each sequence. Then, the output voltage due to effects of factor 2 can be algebraically represented as in equation (4).

$$V_{out,j}(z)\_F2 = \sum_{Mk=1}^{2N}\sum_{i=1}^{2N}(A(2i)_{(2i-1)Mk} + A(2i-1)_{(2i)Mk}) \cdot V_{in}(j)e^{\frac{j\omega z}{v_{Mk}}} = \sum_{Mk=1}^{2N} C1_{Mk}V_{in}(j)e^{\frac{j\omega z}{v_{Mk}}} \quad (4)$$

Figure 2A:
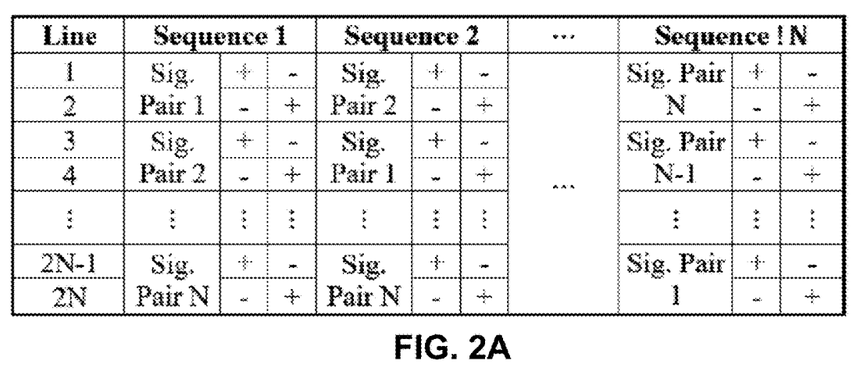
FIG. 2A presents a table of sequences in accordance with the disclosed embodiments.

Note that the coefficient $C1_{Mk}$ is independent of the individual signal line and is only related to the mode number. To satisfy the twist requirements to alleviate factors 1 and 2, there are in total N!×2 sequences, and the differential signal polarities are exchanged for each signal pair of each sequence. Moreover, all the sequences and polarity changes in each differential signal pair are shown in the table that appears in FIG. 2A. Note that the number of sequences can be reduced if symmetrical line structures around the center plane are used because the coefficients $A(k)_{ij}$ will also become symmetrical. Moreover, all of these sequence and position changes can be realized by twists at proper positions.

Figure 2B:
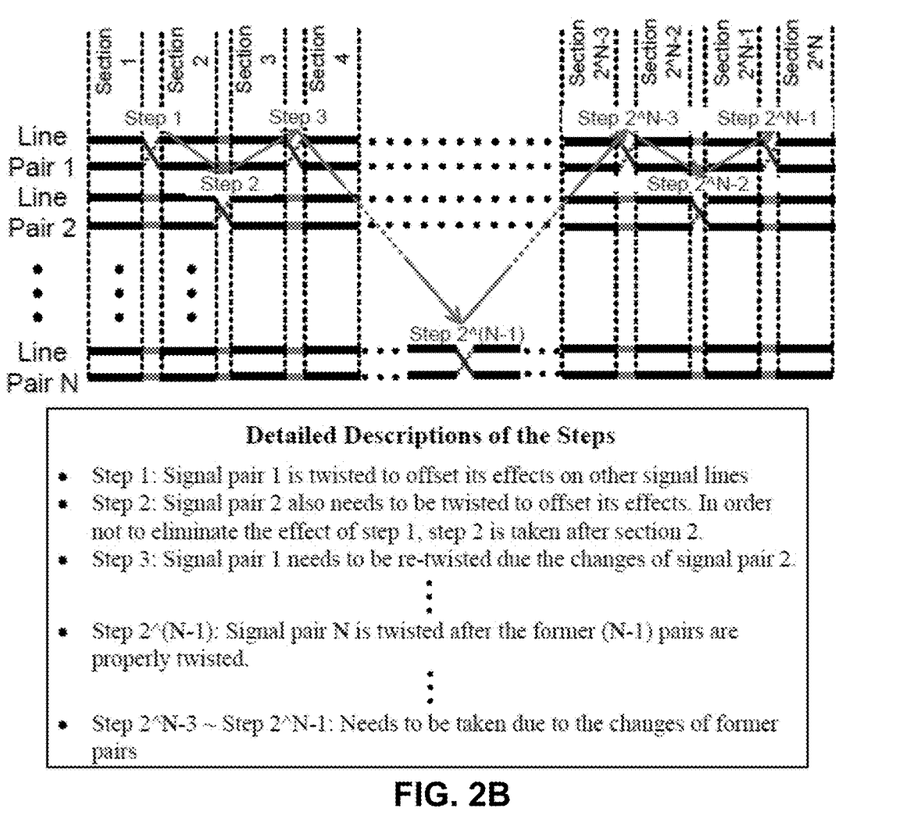
FIG. 2B illustrates a V-type cancellation scheme for a sequence in accordance with the disclosed embodiments.

To address factor 3, the impacts of a single differential pair on the other signals are cancelled by simply switching the signal positions of the differential pair. For the general case of N pairs of differential signals, a systematic V-type cancellation scheme can be used to determine the twist locations, as shown in FIG. 2B, in which detailed steps are described. In total, $2^N-1$ steps are required to cancel the effects of all the differential pairs on the other signals.

IQ Differential Signals

Based on the above analysis, for 2N lines, there are (N!×2×($2^N-1$)) steps. For simplicity, suppose N is limited to two, and the signal lines are symmetrical and are used to transmit IQ differential signals.

Figure 3A:
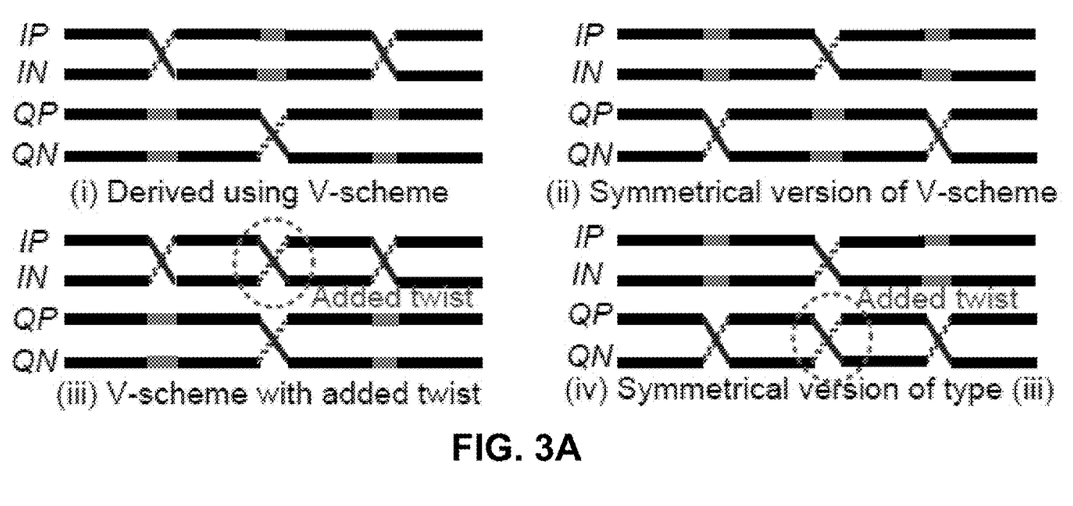
FIG. 3A illustrates a V-type cancellation scheme for four multi-phase signal lines in accordance with the disclosed embodiments.
Figure 3B:
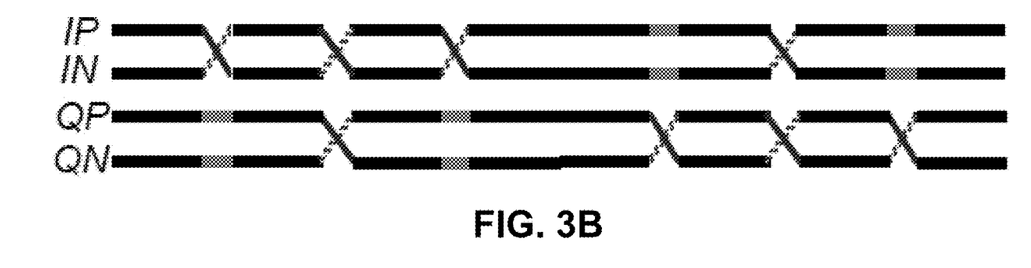
FIG. 3B illustrates a combined cancellation structure, which ensures that each differential pair experiences an equal number of twists, in accordance with the disclosed embodiments.

In this case, the signal pairs 1 and 2 don't need to be switched. Based on the V-type cancellation scheme, type (i) is first derived as shown in FIG. 3A, wherein type (ii) is simply a symmetrical version of type (i). To mitigate mismatches caused by the twists, an additional twist is added, shown as type (iii), with the corresponding symmetrical version appearing as type (iv). Finally, types (iii) and (iv) are combined as shown in FIG. 3B. In this configuration, each individual signal path contains an equal number of twists after the combination, which greatly neutralizes the twisting effects.

Measurements

Figure 4:
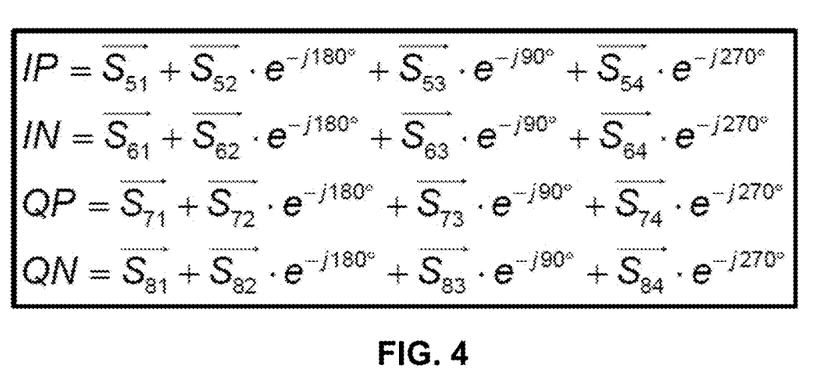
FIG. 4 illustrates equations, which enable signals to be reconstructed using their S-parameters with proper phase information in accordance with the disclosed embodiments.

For demonstration purposes, two FR4 prototype boards were fabricated, wherein a first board without any twisting schemes was used as a reference board, and a second board included the proposed twisting scheme. Measurements were conducted indirectly in the frequency domain. Also, signals were reconstructed using their S-parameters with proper phase information based on the equations that appear in FIG. 4.

Figure 5:
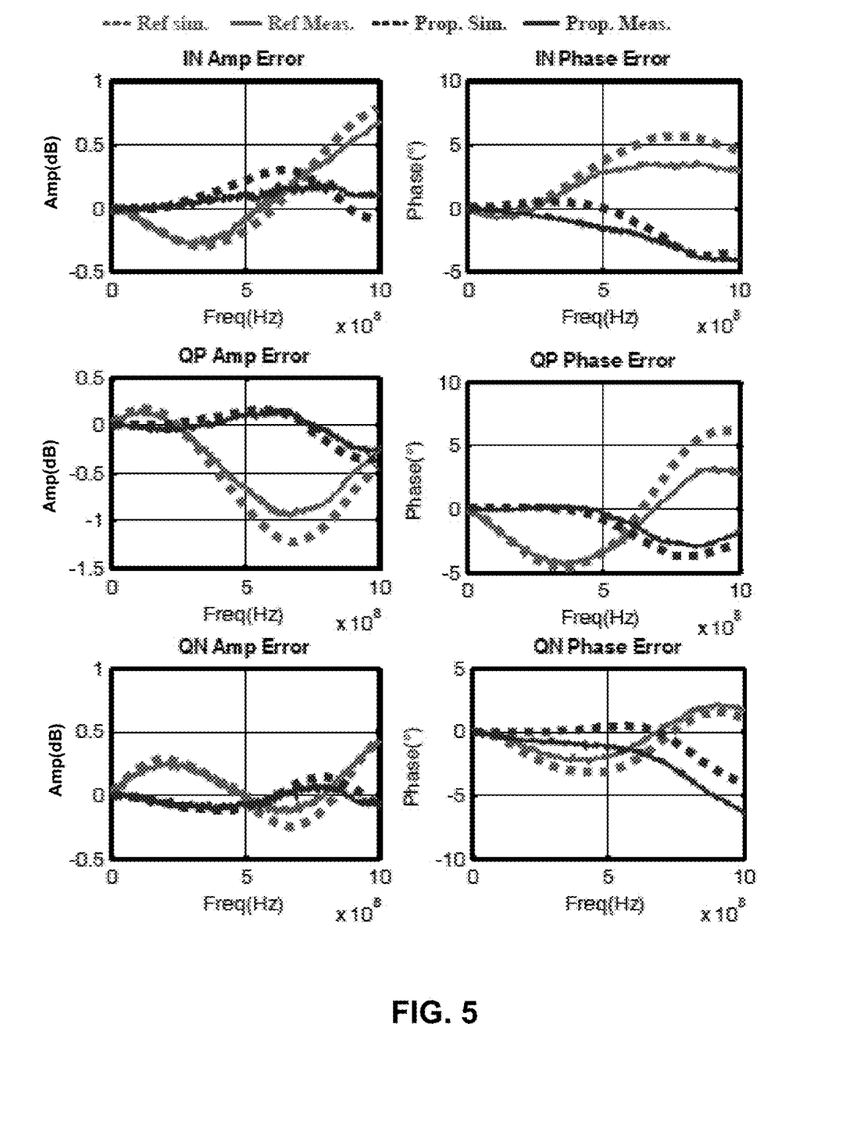
FIG. 5 illustrates measured amplitude and phase errors compared with a reference IP signal in accordance with the disclosed embodiments.

The technique was evaluated in terms of its amplitude errors, phase errors and equivalent phase errors. The amplitude and phase errors are defined as the difference between IN, QP and QN with a reference signal IP. As illustrated in FIG. 5, the simulation results agree with the measurement results, and both amplitude and phase errors are greatly suppressed by this technique.

Figure 6:
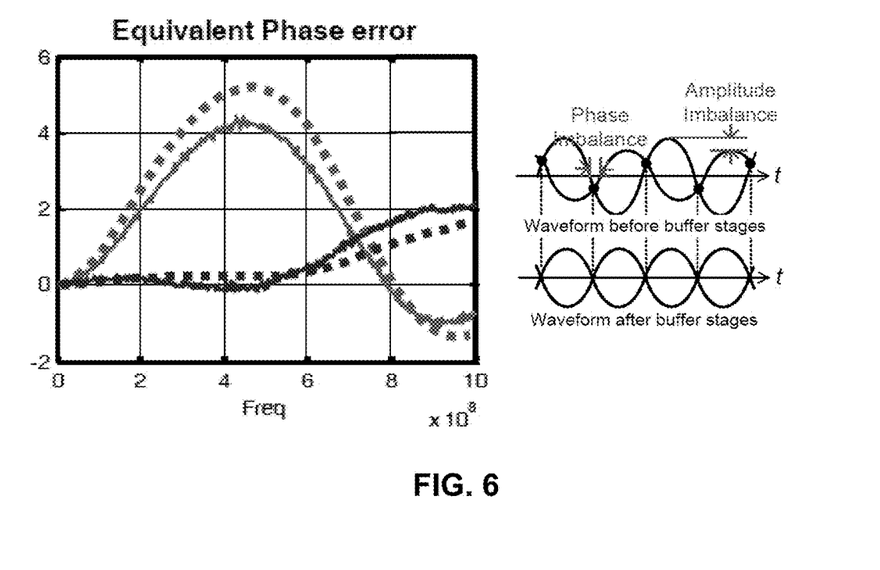
FIG. 6 illustrates phase-error measurement results in accordance with the disclosed embodiments.

As illustrated in FIG. 6, in some situations, we are more concerned about the equivalent phase error as defined by the equation (5) below while evaluating the overall effects of the four signals.

$$\phi = \frac{\phi_{QP} - \phi_{IP} + \phi_{QN} - \phi_{IN}}{2} + 90° \quad (5)$$

Figure 7:
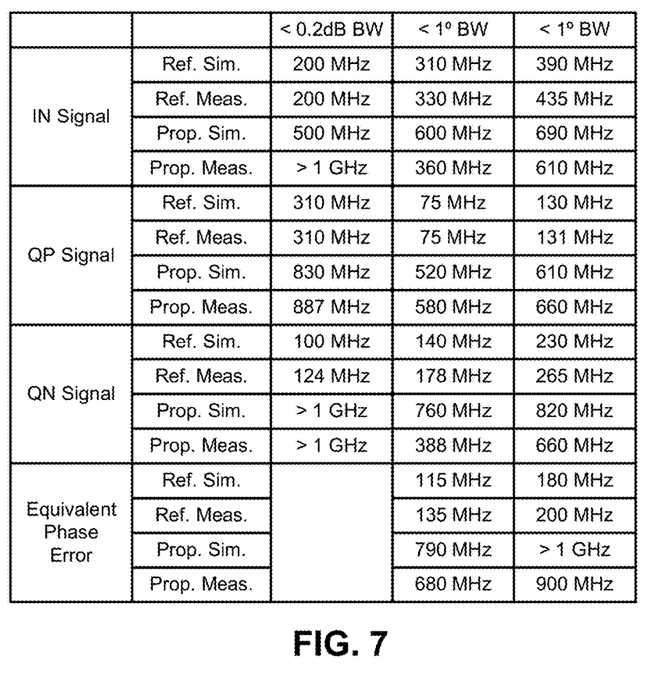
FIG. 7 presents a table listing performance results in accordance with the disclosed embodiments.

Note that the waveforms illustrated in FIG. 6 can be restored in two steps. First, interactions between the imbalanced differential signals are used as the new zero-crossing points. Second, amplitude imbalances are removed when the driver amplifiers are driven to voltage-limiting regions. The resulting performance is summarized in the table that appears in FIG. 7, which uses amplitude error <0.2 dB, phase error <1° and phase error <2° as the criteria. Note that for the amplitude criteria, the bandwidth is boosted from 124 MHz to 887 MHz. Moreover, for the phase criteria of 1°, bandwidth is boosted from 75 MHz to 360 MHz, and the equivalent bandwidth is boosted from 135 MHz to 680 MHz. Also, for the phase criteria of 2°, the bandwidth is boosted from 131 MHz to 610 MHz, and the equivalent bandwidth is boosted from 200 MHz to 900 MHz.

Electronic Device

Figure 8:
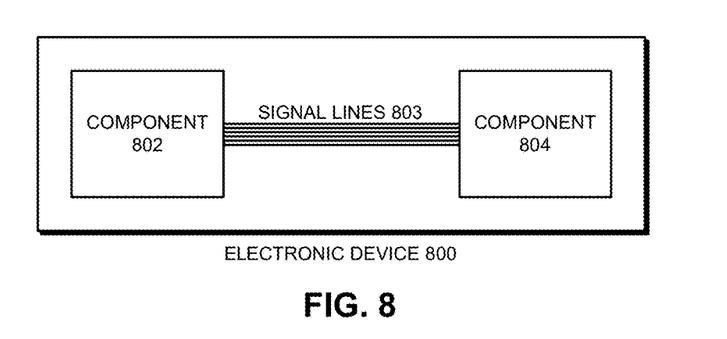
FIG. 8 illustrates an electronic device that uses signal lines to facilitate communication between components in accordance with the disclosed embodiments.

FIG. 8 illustrates an electronic device that uses signal lines to facilitate communications between internal components in accordance with the disclosed embodiments. As illustrated in FIG. 8, an electronic device 800, such as a computer, includes internal components 802 and 804, which communicate through a set of signal lines 803. Note that the above-described coupling balance technique can be applied to signal lines 803 to reduce coupling imbalances among signal lines 803.

CONCLUSION

We presented a systematic coupling balance technique to overcome coupling effects in long-traveling signal lines, and to thereby maintain matched signals. Note that this technique does not consume additional power, and does not require complex circuits or algorithms, which makes it easy to deploy with negligible cost. A proof-of-concept related to IQ signal propagation provides promising results with the 1° mismatch bandwidth extending from 75 MHz to 360 MHz, or from 135 MHz to 680 MHz using the definition of the equivalent phase error. This technique can also be generalized to high frequencies with proper scaling of the component size.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A system that implements a coupling balance scheme for differential signals, comprising:
    a set of 2N signal lines carrying N differential signal pairs, wherein signal lines in the set of 2N signal lines run parallel to each other in a planar layout;
    wherein the set of 2N signal lines is organized into a set of consecutive sequences, wherein each sequence includes a pattern of twists that switch signal positions for each differential pair to cancel coupling effects with respect to other signal lines; and
    wherein the set of 2N signal lines contains four adjacent signal lines, including a first signal line, a second signal line, a third signal line and a fourth signal line, which carry differential signals $D_{1P}$, $D_{1N}$, $D_{2P}$ and $D_{2N}$, respectively, wherein within a given sequence, a pattern of twists is defined so that:
        at a first location, the first and second signal lines twist,
        at a second location, the first and second signal lines twist, and the third and fourth signal lines twist,
        at a third location, the first and second signal lines twist,
        at a fourth location, the third and fourth signal lines twist,
        at a fifth location, the first and second signal lines twist, and the third and fourth signal lines twist, and
        at a sixth location, the third and fourth signal lines twist.

2. The system of claim 1, wherein the first, second, third, and fourth signal lines carry a set of quadrature signals, including:
    an in-phase signal i carried by a first differential signal pair $I_P$ and $I_N$; and
    a quadrature-phase signal Q carried by a second differential signal pair $Q_P$ and $Q_N$.

3. The system of claim 1, wherein the set of 2N signal lines is fabricated on a printed circuit board.

4. The system of claim 1, wherein the set of 2N signal lines is fabricated on a semiconductor layer.

5. An electronic device that implements a coupling balance scheme for differential signals, comprising:
    the electronic device;
    a set of 2N signal lines carrying N differential signal pairs between components of the electronic device, wherein signal lines in the set of 2N signal lines runs parallel to each other in a planar layout;
    wherein the set of 2N signal lines is organized into a set of consecutive sequences, wherein each sequence includes a pattern of twists that switch signal positions for each differential pair to cancel coupling effects with respect to other signal lines; and
    wherein the set of 2N signal lines contains four adjacent signal lines, including a first signal line, a second signal line, a third signal line and a fourth signal line, which carry differential signals $D_{1P}$, $D_{1N}$, $D_{2P}$ and $D_{2N}$, respectively, wherein within a given sequence, a pattern of twists is defined so that:
        at a first location, the first and second signal lines twist,
        at a second location, the first and second signal lines twist, and the third and fourth signal lines twist,
        at a third location, the first and second signal lines twist,
        at a fourth location, the third and fourth signal lines twist,
        at a fifth location, the first and second signal lines twist, and the third and fourth signal lines twist, and
        at a sixth location, the third and fourth signal lines twist.

6. The electronic device of claim 5, wherein the first, second, third, and fourth signal lines carry a set of quadrature signals, including:
    an in-phase signal I carried by a first differential signal pair $I_P$ and $I_N$; and
    a quadrature-phase signal Q carried by a second differential signal pair $Q_P$ and $Q_N$.

7. The electronic device of claim 5, wherein the set of 2N signal lines is fabricated on a printed circuit board.

8. The electronic device of claim 5, wherein the set of 2N signal lines is fabricated on a semiconductor layer.

9. A method for facilitating a coupling balance scheme for differential signals, comprising:
    running N differential signal pairs through a set of 2N signal lines, wherein signal lines in the set of 2N signal lines run parallel to each other in a planar layout;
    wherein the set of 2N signal lines is organized into a set of consecutive sequences, wherein each sequence includes a pattern of twists that switch signal positions for each differential pair to cancel coupling effects with respect to other signal lines; and
    wherein the set of 2N signal lines contains four adjacent signal lines, including a first signal line, a second signal line, a third signal line and a fourth signal line, which carry differential signals $D_{1P}$, $D_{1N}$, $D_{2P}$ and $D_{2N}$, respectively, wherein within a given sequence, a pattern of twists is defined so that:
        at a first location, the first and second signal lines twist,
        at a second location, the first and second signal lines twist, and the third and fourth signal lines twist,
        at a third location, the first and second signal lines twist,
        at a fourth location, the third and fourth signal lines twist,
        at a fifth location, the first and second signal lines twist, and the third and fourth signal lines twist, and
        at a sixth location, the third and fourth signal lines twist.

10. The method of claim 9, wherein the first, second, third, and fourth signal lines carry a set of quadrature signals, including:
    an in-phase signal I carried by a first differential signal pair $I_P$ and $I_N$; and
    a quadrature-phase signal Q carried by a second differential signal pair $Q_P$ and $Q_N$.

* * * * *